United States Patent [19]

Humpston et al.

[11] Patent Number: 5,031,822
[45] Date of Patent: Jul. 16, 1991

[54] METHODS OF JOINING COMPONENTS

[75] Inventors: Giles Humpston, Croxley Green; David M. Jacobson, Wembley; Brian P. Cameron, Streatham, all of England

[73] Assignee: Marconi Electronic Devices Limited, England

[21] Appl. No.: 472,220

[22] Filed: Jan. 30, 1990

[30] Foreign Application Priority Data

Feb. 1, 1989 [GB] United Kingdom ................ 8902200
Sep. 6, 1989 [GB] United Kingdom ................ 8920100

[51] Int. Cl.$^5$ ..................... H01L 21/58; B23K 1/19; B23K 101/40
[52] U.S. Cl. ................................. 228/122; 228/208; 228/263.12; 228/123
[58] Field of Search ........... 228/123, 124, 208, 263.12, 228/122; 437/192

[56] References Cited

U.S. PATENT DOCUMENTS

| 2,793,420 | 5/1957 | Johnston et al. | 228/123 |
| 3,600,144 | 8/1971 | Csakvary | 228/123 |
| 4,418,857 | 12/1983 | Ainslie et al. | 228/124 |

FOREIGN PATENT DOCUMENTS

| 0151354 | 11/1980 | Japan | 437/192 |
| 0151364 | 11/1980 | Japan | 437/192 |
| 0033855 | 4/1981 | Japan | 437/192 |

Primary Examiner—Sam Heinrich
Attorney, Agent, or Firm—Kirschstein, Ottinger, Israel & Schiffmiller

[57] ABSTRACT

A method of brazing a silicon component to a molybdenum and/or tungsten component wherein prior to brazing the surface of the molybdenum and/or tungsten component is first provided with a thin gold coating and then a coating of palladium, platinum or rhodium. This allows satisfactory brazing to be effected using conventional aluminum-based brazes at temperatures below 650° C.

21 Claims, 1 Drawing Sheet

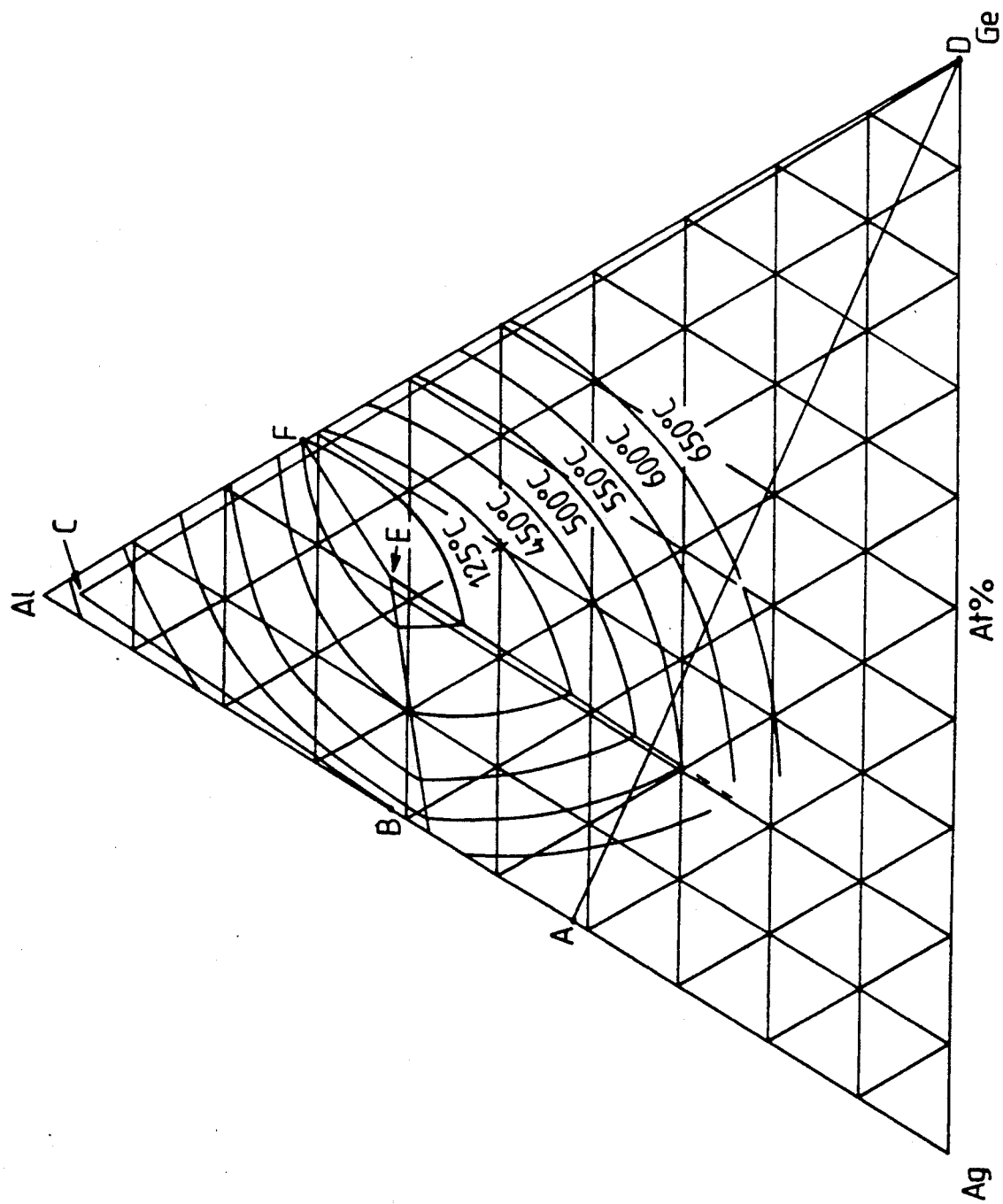

METHODS OF JOINING COMPONENTS

BACKGROUND OF THE INVENTION

1. Field of the Invention

This invention relates to methods of joining components.

More particularly the invention relates to methods of joining a component of molybdenum and/or tungsten to a component of silicon.

2. Description of Related Art

Such methods find application in the manufacture of high power silicon semiconductor devices. In such devices the electrical connections to the silicon wafer in which the device is formed are conventionally made by way of relatively massive copper electrodes, one on each side, which also serve to conduct heat away from the wafer. Ideally the wafer would be bonded directly to these copper electrodes. In practice the difference between the thermal expansion coefficients of copper and silicon renders this impracticable. Instead, one main face of the wafer is conventionally brazed to a molybdenum and/or tungsten backing plate, normally in the form of a disc, and a dry sliding contact between one copper electrode and the disc is made. The other copper electrode makes a dry sliding contact with another molybdenum and/or tungsten disc which in turn makes a dry sliding contact with the main face of the wafer remote from the backing plate, the wafer being unable to withstand the stress associated with two brazed joints.

The silicon wafer is typically joined to the backing plate using an aluminium-based braze. One example of such a braze is the well known Al-12% wt Si braze having a melting point of 577° C. Other examples of such a braze are the well known aluminium-copper-silicon brazes which have a melting point of about 525° C.

When using such aluminium-based brazes to join a silicon component to a component of molybdenum and/or tungsten the brazing operation is typically carried out at a temperature in the range 680°–700° C., i.e. well above the melting point of the braze, for the following reason.

The aluminium-based brazes will not uniformly wet a bare molybdenum or tungsten surface, but at temperatures above about 650° C. a continuous layer of molybdenum or tungsten disilicide forms at the interface between the braze and the disc which the braze can wet.

This relatively high brazing temperature increases dissolution of silicon in the braze which produces two phenomena harmful to device performance.

Firstly, the resulting erosion at the silicon wafer surface tends to be irregular with deep asperities developing in local areas. This is clearly potentially detrimental, especially when semiconductor junctions exist close to the surface of the silicon wafer to be brazed.

Secondly, the dissolved silicon saturated with aluminium precipitates on cooling below the brazing temperature. Most of this silicon forms as a regrowth layer on the eroded surface of the silicon wafer, and because it is saturated with aluminium, the regrowth layer will exhibit p-type conductivity. If the silicon wafer has an n-type doping surface, an extraneous p-n junction will therefore be formed in the wafer between the regrowth layer and undissolved silicon which may be harmful to device peformance.

SUMMARY OF THE INVENTION

It is an object of the present invention to provide a method of brazing a component of silicon to a component of molybdenum and/or tungsten using an aluminium-based braze wherein this problem is alleviated.

According to the present invention there is provided a method of joining a first component of silicon or a silicon based material to a second component of molybdenum and/or tungsten or a molybdenum and/or tungsten based material by brazing wherein; prior to brazing, the surface to be brazed of the second component is provided with a coating consisting substantially of gold between 0.2 and 1.0 micron thick, and the gold coating is provided with a coating whose volume is between 0.5 and 5 volume % of the volume of the joint to be formed and which consists substantially of one or more of the metals palladium, platinum and rhodium; and the brazing is carried out a temperature of less than 650° C.

Preferably, prior to the application of the palladium and/or platinum and/or rhodium coating, the gold coating is heat treated to cause it to diffuse partly into the material of the second component.

It will be appreciated that while a method according to the invention is of particular advantage when the braze used is an aluminum based braze, in so far as the method enables a silicon component to be brazed or soldered to a component of molybdenum and/or tungsten at a relatively low temperature, the method may also find application with other brazes.

BRIEF DESCRIPTION OF THE DRAWINGS

Several methods in accordance with the invention will now be described, by way of example, with reference to the accompanying drawing which is a ternary diagram for silver-aluminum-germanium alloys.

DETAILED DESCRIPTION OF THE PREFERRED EMBODIMENTS

In the methods to be described one main face of a silicon wafer is joined to one main face of a molybdenum disc of the same diameter.

As a first step the surface of the molybdenum disc is thoroughly cleaned using conventional techniques. The surface of the disc is then made cathodic in a nickel sulphate strike solution and a cathode strike carried out at a current density of 80–100 mA/cm$^2$ for 30 seconds so as to deposit a nickel layer less than 0.05 $\mu$m thick.

After rinsing, the disc is provided with a gold coating by plating with gold for 30 seconds at a current density of 10 mA/cm$^2$ using a pure gold plating solution to produce a gold coating of thickness approximately 0.5 $\mu$m.

After further rinsing, the disc is heated for 10 minutes at a temperature of 800° C. in a furnace containing an atmosphere of industrial purity hydrogen to cause the gold coating to diffuse partly into the molybdenum disc.

After further cleaning and rinsing the gold coating is plated with palladium at a current density of 7.5 mA/cm$^2$ for three minutes, to produce a palladium coating of thickness approximately 0.5 $\mu$m.

After a final rinse, the disc is brazed to the silicon wafer.

In one particular method the brazing operation is carried out at a temperature of about 600° C. using an Al-12 wt % Si braze preform of thickness in the range 15 to 100 $\mu$m or a layer of the Al-12 wt % Si braze of thickness in the range 15 to 100 $\mu$m applied to the silicon wafer, or separate coatings of aluminum and silicon of thickness ratio 88:12 and total thickness in the range 15 to 100 μm.

It will be appreciated that a method according to the invention finds particular application where the brazing is carried out using a low temperature braze. Thus, the invention finds particular application where the brazing is carried out using a braze having a primary constituent of composition lying within the quadrilateral ABCD shown on the accompanying drawing, where points A, B, C and D respectively correspond to compositions as follows:

| Point | Silver(Ag) | Aluminum(Al) | Germanium(Ge) | |
|-------|------------|--------------|---------------|------|
| A | 58 | 42 | 0 | At. % |
|   | (84.7 | 15.3 | 0 | Wt. %) |
| B | 38 | 62 | 0 | At. % |
|   | (71.0 | 29.0 | 0 | Wt. %) |
| C | 2 | 96 | 2 | At. % |
|   | (7.3 | 87.8 | 4.9 | Wt. %) |
| D | 0.5 | 0.5 | 99 | At. % |
|   | (0.7 | 0.2 | 99.1 | Wt. %) |

The entire range of alloys bounded by this quadrilateral freeze at approximately 410° C. Isotherms corresponding to liquidus temperatures of alloys within the quadrilateral ABCD are indicated by lines marked with the liquidus temperatures. The ternary eutectic alloy indicated by point E corresponding to a composition of 17 At % Ag, 62 At % Al and 21 At % Ge (36.45 Wt % Ag, 33.25 Wt % Al and 30.30 Wt % Ge) uniquely has a liquidus temperature of 410° C., i.e. the same as its solidus temperature. At this temperature a reversible transformation occurs between the liquid alloy, on the one hand, and the intermetallic compound Ag₃Al, aluminium and germanium on the other hand. This ternary eutectic reaction may be represented by the equation

$$\text{liquid} \underset{}{\overset{410°\ C.}{\rightleftharpoons}} Ag_3Al + Al + Ge$$

In the light of the above it will be appreciated that brazing alloys having as their primary constituent (i.e. consisting of or based on) an alloy of composition falling within the quadrilateral ABCD constitute brazing alloys which are suitable for use in application where aluminium-silicon based alloys are commonly used, but which have lower melting points. In alloys based on the specified Ag-Al-Ge alloys the quantity and composition of the additional material will of course be chosen with a view to not significantly affecting the desirable characteristics, e.g. low melting point, of the base Ag-Al-Ge alloy, and may suitably comprise copper and/or silicon.

While any alloy consisting of, or based on an alloy having a composition within the quadrilateral ABCD provides a braze with a freezing point of or near 410° C., not all alloys consisting of or based on alloys having compositions within the quadrilateral can be produced in the form of ductile brazing foil by conventional mechanical reduction, in particular by rolling.

By and large it is those alloys consisting of or based on compositions situated in the area ABEFD shown in the FIGURE that are unlikely to be capable of production in the form of brazing foil. On the other hand, many alloys consisting of or based on compositions within the area CBEF can be hot-rolled to foil, or produced as rod, wire, rings and other shapes where the point F corresponds to a composition of 0 At % Ag, 71.5 At % Al and 28.5 At % Ge (0 Wt% Ag, 48.25 Wt % Al and 51.75 Wt % Ge).

Alloys can of course alternatively be produced in foil form directly from molten alloy by rapid solidification techniques. Vapour phase deposition techniques, such as sputtering, can also be used to apply thin coatings of alloys to the surfaces of components to be joined.

In further particular methods according to the invention other low temperature brazes may be used. In one such other method two discrete layers consisting respectively of silver and either tin or indium are used, the two layers having volumes in a ratio different from that in a eutectic alloy formed by silver and the other metal. The joining operation is then carried out at a temperature above the melting point of the eutectic alloy, e.g. at about 275° C. for a silver-tin system and at about 175° C. for a silver-indium system, for a period sufficient to cause, initially, formation of the eutectic alloy, and then by reaction between the eutectic alloy and one or other of silver and the other metal, formation of a material having a melting point higher than the melting point of the eutectic alloy. Such a method forms the subject of United Kingdom patent application No. 8920101.6.

Satisfactory joints are obtained using a method according to the present invention because the palladium/platinum/rhodium coating dissolves into the braze used and the latter then wets and bonds to the gold coating.

In a method according to the invention the limits on the thickness of the gold coating arise from the need to have a sufficient concentration of gold to provide good adhesion of the palladium/platinum/rhodium coating, and subsequently the braze while at the same time ensuring that there is insufficient gold available to form embrittling intermetallic phases by reaction with the braze. In practice this is found to require the gold coating to have a thickness in the range 0.2 to 1.0 μm.

The minimum thickness of the palladium/platinum/rhodium coating is set by the need for a layer over the gold surface that is sufficiently thick to protect the underlying molybdenum or tungsten against oxidation. The maximum thickness is determined by the proportion of intermetallic phases formed between the materials of the coating and the braze that can be tolerated in the joint. As the thickness of the coating increases, the proportion of the intermetallic phases in the joint will increase until they cause joint embrittlement or mechanical failure of the silicon component. In practice this is found to require the palladium/platinum/rhodium coating to have a thickness between 0.5 and 5 volume % of the joint volume, e.g. for a joint of thickness 50 μm, a palladium/platinum/rhodium coating of thickness in the range 0.25 to 2.5 μm is required.

For the avoidance of doubt it is pointed out that in the present specification the term brazing is used both for processes carried out above and processes carried out below 450° C., which is sometimes regarded as the boundary between brazing and soldering.

We claim:
1. A method of joining a first component which consists at least primarily of silicon to a second component which consists at least primarily of at least one of molybdenum and tungsten by brazing, comprising the steps of: prior to brazing, applying over the surface to be brazed of the second component a coating consisting substantially of gold between 0.2 and 1.0 micron thick, and applying over the gold coating a coating whose volume is between 0.5 and 5 volume % of the volume of the joint to be formed and which consists substantially of at least one of the metals palladium, platinum and rhodium; and carrying out the brazing at a temperature less than 650° C.

2. A method according to claim 1 wherein prior to the application of said coating of at least one of the metals palladium, platinum and rhodium, the gold coating is heat treated to cause it to diffuse partly into the material of the second component.

3. A method according to claim 2 wherein said gold coating is heat treated at a temperature of substantially 800° C.

4. A method according to claim 1 wherein said surface to be brazed of the second component comprises a surface of a nickel coating applied to said second component prior to application of the gold coating to the second component.

5. A method according to claim 1 wherein said coatings are formed by electro-plating processes.

6. A method according to claim 1 wherein brazing is carried out using an aluminium based braze.

7. A method according to claim 6 wherein brazing is carried out using an aluminium-silicon braze.

8. A method according to claim 5 wherein brazing is carried out using a braze having a composition in the composition quadrilateral defined by the points: 84.7wt % silver, 15.3wt % aluminium, 0 wt % germanium; 71.0 wt % silver, 29.0 wt % aluminium, 0 wt % germanium; 7.3 wt % silver, 87.8 wt % aluminium, 4.9 wt % germanium; and 0.7 wt % silver, 0.2 wt % aluminium, 99.1 wt % germanium.

9. A method according to claim 2 wherein said surface to be brazed of the second component comprises a surface of a nickel coating applied to said second component prior to application of the gold coating to the second component.

10. A method according to claim 3 wherein said surface to be brazed of the second component comprises a surface of a nickel coating applied to said second component prior to application of the gold coating to the second component.

11. A method according to claim 2 wherein said coatings are formed by electro-plating processes.

12. A method according to claim 3 wherein said coatings are formed by electro-plating processes.

13. A method according to claim 4 wherein said coatings are formed by electro-plating processes.

14. A method according to claim 2 wherein brazing is carried out using an aluminum based braze.

15. A method according to claim 3 wherein brazing is carried out using an aluminum based braze.

16. A method according to claim 4 wherein brazing is carried out using an aluminum based braze.

17. A method according to claim 5 wherein brazing is carried out using an aluminum based braze.

18. A method according to claim 2 wherein brazing is carried out using a braze having a composition in the composition quadrilateral defined by the points: 84.7 wt % silver, 15.3 wt % aluminum, 0 wt % germanium; 71.0 wt % silver, 29.0 wt % aluminum, 0 wt % germanium; 7.3 wt % silver, 87.8 wt % aluminum, 4.9 wt % germanium; and 0.7 wt % silver, 0.2 wt % aluminum, 99.1 wt % germanium.

19. A method according to claim 3 wherein brazing is carried out using a braze having a composition in the composition quadrilateral defined by the points: 84.7 wt % silver, 15.3 wt % aluminum, 0 wt % germanium; 71.0 wt % silver, 29.0 wt % aluminum, 0 wt % germanium; 7.3 wt % silver, 87.8 wt % aluminum, 4.9 wt % germanium; and 0.7 wt % silver, 0.2 wt % aluminum, 99.1 wt % germanium.

20. A method according to claim 4 wherein brazing is carried out using a braze having a composition in the composition quadrilateral defined by the points: 84.7 wt % silver, 15.3 wt % aluminum, 0 wt % germanium; 71.0 wt % silver, 29.0 wt % aluminum, 0 wt % germanium; 7.3 wt % silver, 87.8 wt % aluminum, 4.9 wt % germanium; and 0.7 wt % silver, 0.2 wt % aluminum, 99.1 wt % germanium.

21. A method according to claim 5 wherein brazing is carried out using a braze having a composition in the composition quadrilateral defined by the points: 84.7 wt % silver, 15.3 wt % aluminum, 0 wt % germanium; 71.0 wt % silver, 29.0 wt % aluminum, 0 wt % germanium; 7.3 wt % silver, 87.8 wt % aluminum, 4.9 wt % germanium; and 0.7 wt % silver, 0.2 wt % aluminum, 99.1 wt % germanium.

* * * * *